United States Patent
Yun et al.

(10) Patent No.: US 11,490,509 B2
(45) Date of Patent: Nov. 1, 2022

(54) MODULE SUBSTRATE AND SEMICONDUCTOR MODULE INCLUDING THE SAME

(71) Applicant: Samsung Electronics Co., Ltd., Suwon-si (KR)

(72) Inventors: Sunki Yun, Yongin-si (KR); Kwangkyu Bang, Hwaseong-si (KR); Jihong Kim, Seongnam-si (KR); Eunji Yu, Hwaseong-si (KR); Kyungjae Kim, Hwaseong-si (KR); Yusuf Cinar, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/358,800

(22) Filed: Jun. 25, 2021

(65) Prior Publication Data
US 2022/0124904 A1    Apr. 21, 2022

(30) Foreign Application Priority Data

Oct. 20, 2020  (KR) .......................... 10-2020-0135836

(51) Int. Cl.
*H05K 1/02*    (2006.01)
*H05K 1/11*    (2006.01)
*H05K 1/14*    (2006.01)

(52) U.S. Cl.
CPC ........... *H05K 1/0268* (2013.01); *H05K 1/112* (2013.01); *H05K 1/141* (2013.01); *H05K 2201/10159* (2013.01)

(58) Field of Classification Search
CPC ....... H05K 1/0268; H05K 1/112; H05K 1/141
See application file for complete search history.

(56) References Cited

U.S. PATENT DOCUMENTS

| | | | |
|---|---|---|---|
| 7,741,709 B2 | 6/2010 | Huang et al. | |
| 8,379,426 B2 | 2/2013 | Bang et al. | |
| 10,791,632 B1 | 9/2020 | Patterson et al. | |

FOREIGN PATENT DOCUMENTS

| | | |
|---|---|---|
| JP | 2003-0338672 A | 11/2003 |
| JP | 2005-0223266 A | 8/2005 |
| JP | 2015-0053363 A | 3/2015 |
| KR | 1998-0079794 A | 11/1998 |
| KR | 10-654085 B1 | 11/2006 |
| WO | WO-2018/165538 A1 | 9/2018 |

OTHER PUBLICATIONS

European Office Action dated Sep. 13, 2022 issued in European Patent Application No. 21 187 443.3-1211.

*Primary Examiner* — Jeremy C Norris
(74) *Attorney, Agent, or Firm* — Harness, Dickey & Pierce, P.L.C.

(57) ABSTRACT

A module substrate for a semiconductor module including a wiring substrate having an upper surface and a lower surface opposite to each other and including a wiring formed therein, the wiring substrate having at least one through groove in at least one sidewall and extending in a thickness direction, and a through-groove test terminal including at least one contact pad, a surface of the contact pad being exposed from an inner wall of the through-groove, the contact pad being spaced apart from a vertical plane extending from the sidewall of the wiring substrate may be provided.

20 Claims, 9 Drawing Sheets

MODULE SUBSTRATE AND SEMICONDUCTOR MODULE INCLUDING THE SAME

PRIORITY STATEMENT

This application claims priority under 35 U.S.C. § 119 to Korean Patent Application No. 10-2020-0135836, filed on Oct. 20, 2020 in the Korean Intellectual Property Office (KIPO), the contents of which are herein incorporated by reference in their entirety.

BACKGROUND

1. Field

Example embodiments relate to module substrates and/or semiconductor modules including the same. More particularly, example embodiments relate to module substrates for a memory module such as a solid state drive (SSD) and/or semiconductor modules including the same.

2. Description of the Related Art

A memory module such as a card-type SSD may be connected to a host system through a connector. A module substrate for the memory module may include test terminals as debugging pads. However, when the number of electronic components disposed on the module substrate increases and the module substrate has a small form factor, it may be difficult to secure a design space for the test terminals and to satisfy design regulations.

SUMMARY

Some example embodiments provide module substrates capable of easily securing a design space for test pads.

Some example embodiments provide semiconductor modules including the module substrate.

According to some example embodiments, a module substrate for a semiconductor module may include a wiring substrate having an upper surface and a lower surface opposite to each other and including a wiring formed therein, the wiring substrate having at least one through groove in at least one sidewall and extending in a thickness direction, and a through-groove test terminal including at least one contact pad, a surface of the contact pad being exposed from an inner wall of the through groove. The contact pad may be spaced apart from a vertical plane extending from the sidewall of the wiring substrate.

According to some example embodiments, a module substrate for a semiconductor module may include a wiring substrate including first to fifth insulation layers and first to fourth conductive patterns between the first to fifth insulation layers, the wiring substrate having at least one through groove, the through groove in at least one sidewall of the wiring substrate and extending in a stacking direction of the first to fifth insulation layers, and a through-groove test terminal including first to fourth contact pads, the first to fourth contact pads electrically connected to the first to fourth conductive patterns, respectively, surfaces of the first to fourth contact pads being exposed from an inner wall of the through groove. The first to fourth contact pads may be spaced apart from a vertical plane extending from the sidewall of the wiring substrate. A first distance between both end portions of the inner wall of the through groove that are in contact with the sidewall of the wiring substrate is within a range of 200 µm to 800 µm, and a second distance between each of the first to fourth contact pads and the vertical plane is within a range of 80 µm to 320 µm.

According to some example embodiments, a semiconductor module may include a wiring substrate including a plurality of insulation layers and conductive patterns on the insulation layers, respectively, the wiring substrate having at least one through groove in at least one sidewall and extending in a stacking direction of the insulation layers, a semiconductor device on an upper surface or a lower surface of the wiring substrate, and a through-groove test terminal electrically connected to the conducive patterns for electrically inspecting the semiconductor device, the through-groove test terminal including a plurality of contact pads, surfaces of the contact pads being exposed from an inner wall of the through groove. The exposed surfaces of the contact pads may be arranged along the inner wall of the through groove and may be spaced apart from a vertical plane extending from the sidewall of the wiring substrate.

According to some example embodiments, a semiconductor module may include a module substrate and a semiconductor device on the module substrate. The module substrate may include a wiring substrate having at least one through groove in a sidewall and extending in a thickness direction and a through-groove test terminal having at least one contact pad exposed from an inner wall of the through groove.

The through-groove test terminal may include a plurality of contact pads on the inner wall of the through groove and spaced apart from each other in the thickness direction. The through-groove test terminal may be spaced apart by a distance from a vertical plane extending from the sidewall of the wiring substrate. The through-groove test terminal may be spaced apart by a distance from a horizontal plane extending from an upper surface or a lower surface of the wiring substrate.

Accordingly, interface signal connection terminals for inspection of a semiconductor device may be arranged in a sidewall of a wiring substrate having a small or micro form factor, thereby securing a design space for debug pads. Additionally, because copper contact pads are not exposed from a sidewall of the wiring substrate, it may be possible to improve contact reliability with the inspection pogo pin while satisfying PCB design regulations.

BRIEF DESCRIPTION OF THE DRAWINGS

Some example embodiments will be more clearly understood from the following detailed description taken in conjunction with the accompanying drawings.

FIG. 1 is a plan view illustrating a memory module in accordance with some example embodiments.

FIG. 2 is an enlarged perspective view illustrating portion 'I' in FIG. 1.

FIG. 3 is a plan view illustrating a portion of an inspection pad portion of a memory module in accordance with some example embodiments.

FIG. 4 is a cross-sectional view taken along the line A-A' in FIG. 3.

FIG. 5 is a perspective view illustrating a through-groove test terminal of the inspection pad portion in FIG. 3.

FIG. 6 is a plan view illustrating a fourth contact pad of the through-groove test terminal in FIG. 5.

FIG. 7 is a front view illustrating the through-groove test terminal in FIG. 5.

FIG. 8 is a plan view illustrating a portion of an inspection pad portion of a memory module in accordance with some example embodiments.

FIG. 9 is a cross-sectional view taken along the line B-B' in FIG. 8.

FIG. 10 is a perspective view illustrating a through-groove test terminal of the inspection pad portion in FIG. 8.

FIG. 11 is a plan view illustrating a fourth contact pad and a plating pattern of the through-groove test terminal in FIG. 10.

FIG. 12 is a front view illustrating the through-groove test terminal in FIG. 10.

FIG. 13 is a cross-sectional view illustrating a through groove test terminal formed in a wiring substrate in accordance with some example embodiments.

FIG. 14 is a plan view illustrating a memory module in accordance with some example embodiments.

DETAILED DESCRIPTION

Hereinafter, some example embodiments will be explained in detail with reference to the accompanying drawings.

Figure 1:
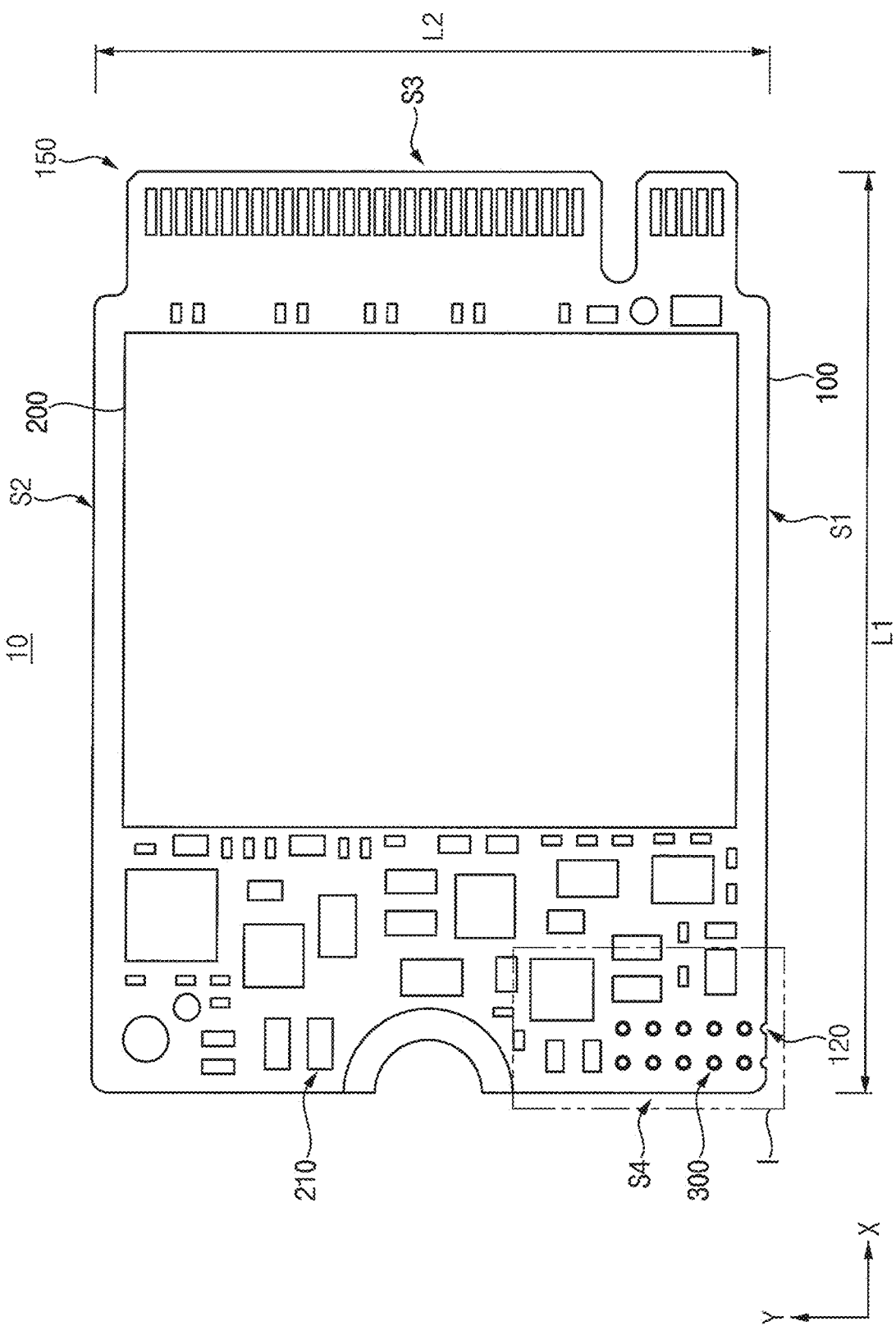
FIGS. 1 to 14 represent non-limiting, example embodiments as described herein.
Figure 2:
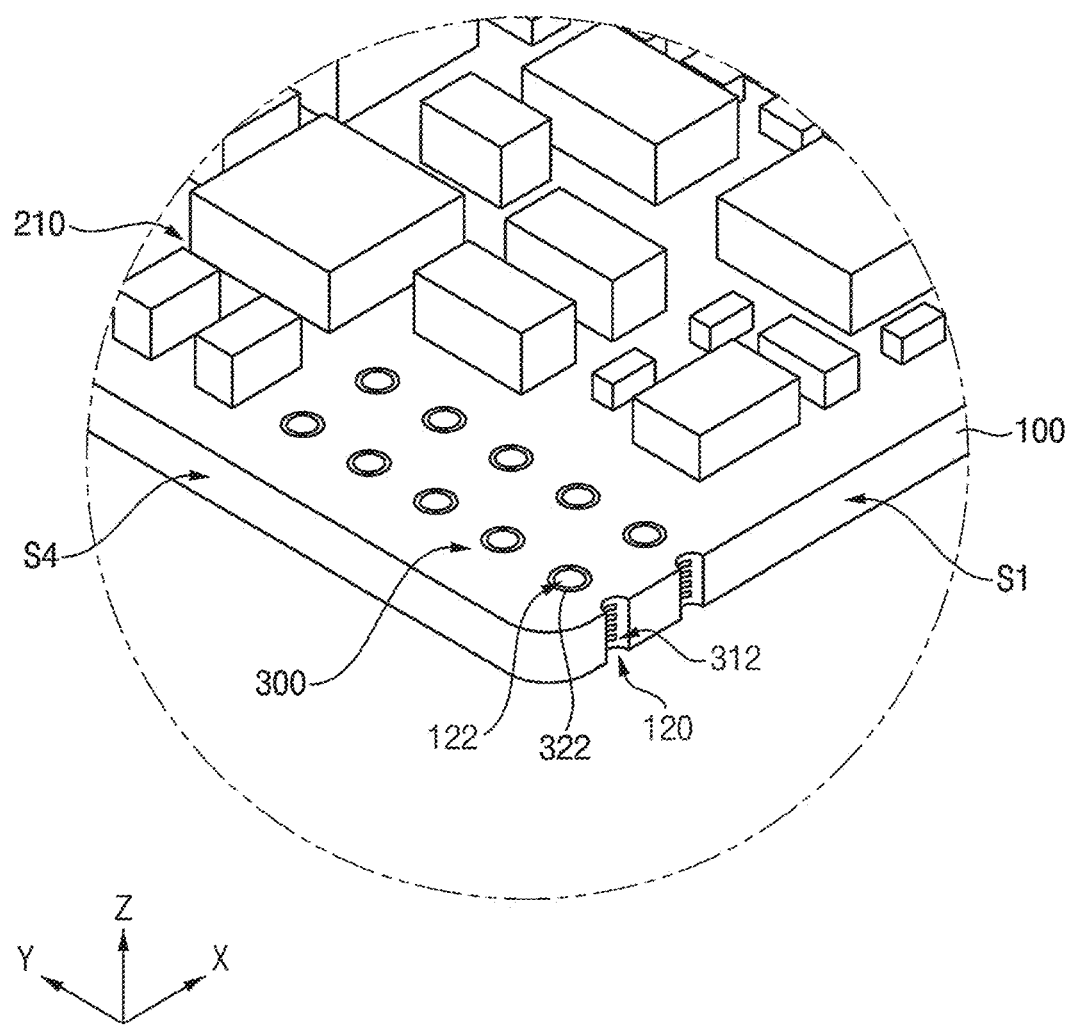

FIG. 1 is a plan view illustrating a memory module in accordance with some example embodiments. FIG. 2 is an enlarged perspective view illustrating portion 'I' in FIG. 1.

Referring to FIGS. 1 and 2, a memory module 10 may include a module substrate 100, a semiconductor device 200 mounted on the module substrate 100 and an inspection pad portion 300 provided in a peripheral region of the module substrate 100. Additionally, the memory module 10 may further include passive devices 210 arranged on the module substrate 100.

In some example embodiments, the module substrate 100 may be a multi-layered circuit substrate having an upper surface and a lower surface opposite to each other. For example, the module substrate 100 may be a printed circuit board (PCB). As described later, the PCB may include wirings on or in the surface thereof and vias connected to the wirings. The wirings may include conductive patterns for interconnecting with the semiconductor device and the passive devices.

The module substrate 100 may extend in a first direction (X direction). The module substrate 100 may have a rectangular or square shape. The module substrate 100 may have a first sidewall S1 and a second sidewall S2 opposite to each other, a third sidewall S3 adjacent to the first sidewall S1 and a fourth sidewall S4 opposite to the third sidewall S3. A connector 150 having connection terminals for connection with a host system (not illustrated) may be provided in the third sidewall S3 of the module substrate 100.

The module substrate 100 may have a small or micro form factor (F/F) shape. The module substrate 100 may provide a 22×30 F/F design space. A length L1 of the module substrate 100 in the first direction may be 30 mm, and a length L2 of the module substrate 100 in a second direction (Y direction) may be 22 mm. However, it will be understood that the size of the module substrate is not limited thereto.

In some example embodiments, the semiconductor device 200 may include a BGA type multi-chip package including an SSD controller, nonvolatile memory devices and buffer memory devices. The semiconductor device 200 may be mounted on the module substrate 100 such that the memory module 10 is provided as solid state drive (SSD). The SSD may be used to replace a hard disk in a PC, notebook, etc. The SSD may be used in a mobile device such as smart phone, tablet PC, digital camera, MP3 player, or PDA.

The SSD controller may communicate a signal with the host using a host interface. The host interface may include a universal serial bus (USB), a small computer system interface (SCSI), a PCI express, an ATA, a parallel ATA, a serial ATA, a serial attached SCSI, etc. In here, the signal communicated between the SSD controller and the host may include a command, an address, data, etc. The SSD controller may analyze and process the signal inputted from the host.

A plurality of the non-volatile memory devices may be used as a storage medium of the SSD. For example, the non-volatile memory device may include NAND flash memories. The non-volatile memory devices may be connected to the SSD controller through at least one channel CH. The SSD may use non-volatile memories such as PRAM, MRAM, ReRAM, or FRAM as a storage medium in place of flash memory.

The buffer memory device may be used as a buffer area temporarily storing data received from the host or temporarily storing data read from the non-volatile memory devices. Additionally, the buffer memory device may be used to drive software S/W used for an effective management of the non-volatile memory devices. Further, the buffer memory device may be used to store meta data received from the host and/or may be used to store cache data.

For example, the buffer memory device may include at least one DRAM chip. The SSD may be embodied by replacing the DRAM with volatile memories (e.g., SRAM) or non-volatile memories (e.g., flash memory, FRAM, MRAM, ReRAM, or FRAM).

In some example embodiments, the passive devices may be arranged on the upper surface or the lower surface of the module substrate 100. The passive devices may include an inductor, a capacitor, a register, etc.

The memory module 10 may further include a power management IC (PMIC) for adjusting a power applied to the semiconductor device.

In some example embodiments, the inspection pad portion 300 may include test terminals 312, 322 provided in the peripheral region of the module substrate 100 to electrically testing the semiconductor device 200. The test terminals may be electrically connected to the semiconductor device 200 by wirings such as signal lines. The semiconductor device 200 may be electrically tested by connecting the test terminal to a pogo pin, which is a connection terminal of a tester (not illustrated).

For example, the inspection pad portion 300 may include 12 test terminals 312, 322 (2×6 Pin). The inspection pad portion 300 may include two through-groove test terminals 312 and ten via-hole test terminals 322. In this case, the connection terminal of the tester may include 12 pogo pins corresponding to the test terminals. The test terminals 312, 322 of the inspection pad portion 300 may be used to debug a firmware code of the semiconductor device 200. For example, in development and mass production stages of SSD products, a test task may be performed using the test terminals 312, 322 as input/output signal pins to find and correct logical errors or abnormal operations (bugs) when driving the semiconductor device 200.

As described later, the through-groove test terminal 312 may be provided to be exposed to an inner wall of a through groove 120 which is formed in the first sidewall S1 of the module substrate 100. The via-hole test terminal 322 may be formed on an inner wall of a via hole 122 which penetrates the module substrate 100. The via-hole test terminal 322 may include a through hole via.

Hereinafter, the through-groove test terminal of the inspection pad portion will be explained.

Figure 3:
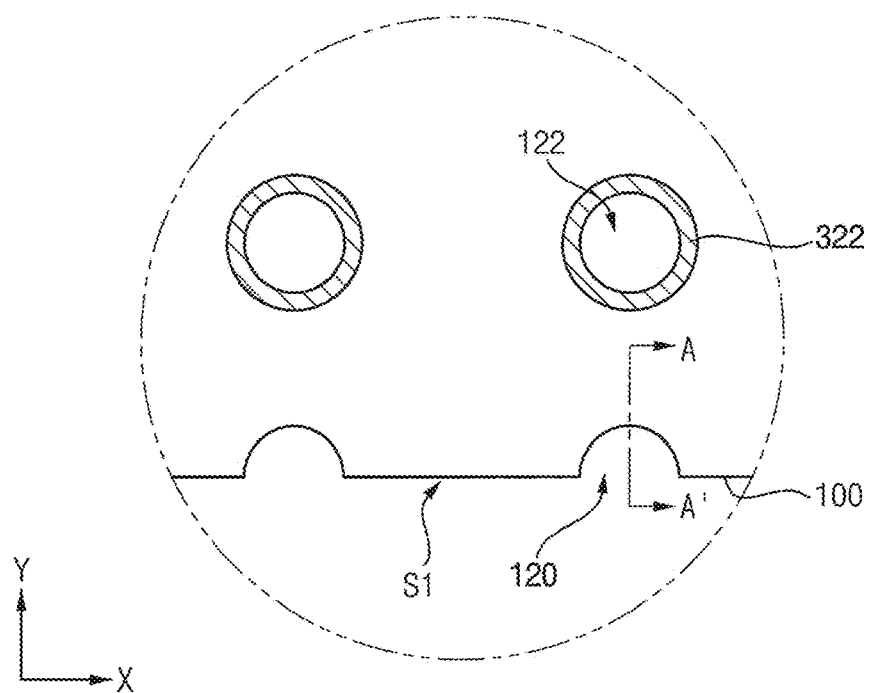
Figure 4:
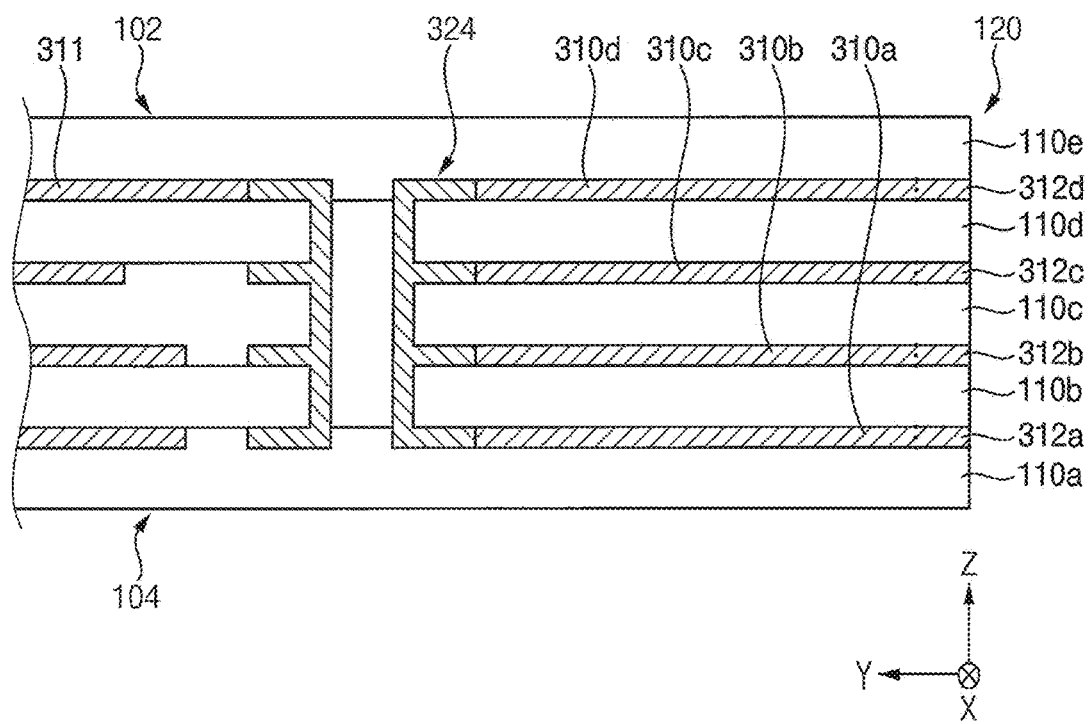
Figure 5:
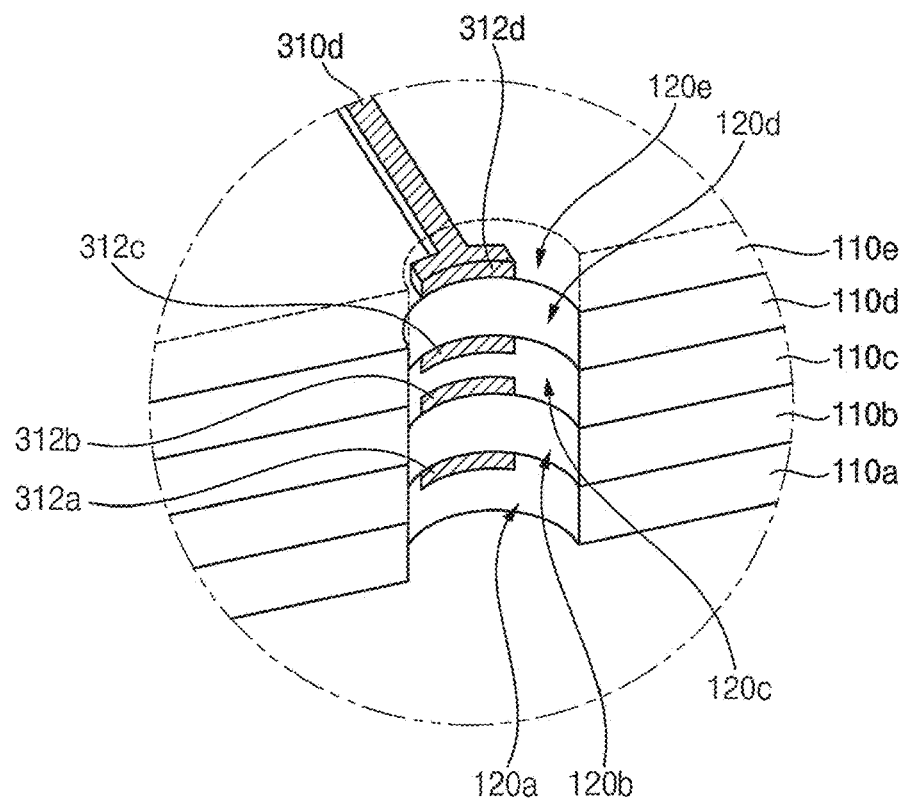
Figure 6:
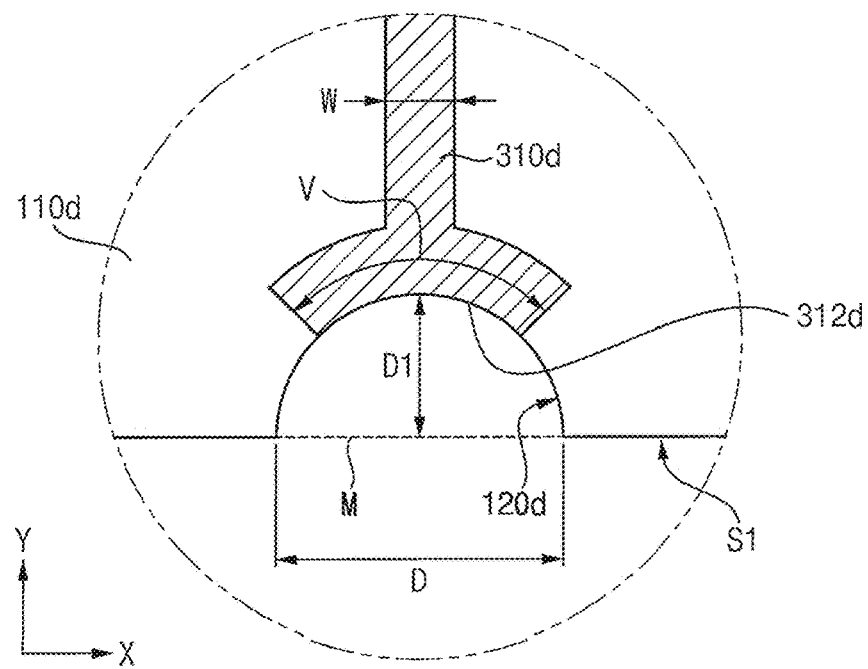
Figure 7:
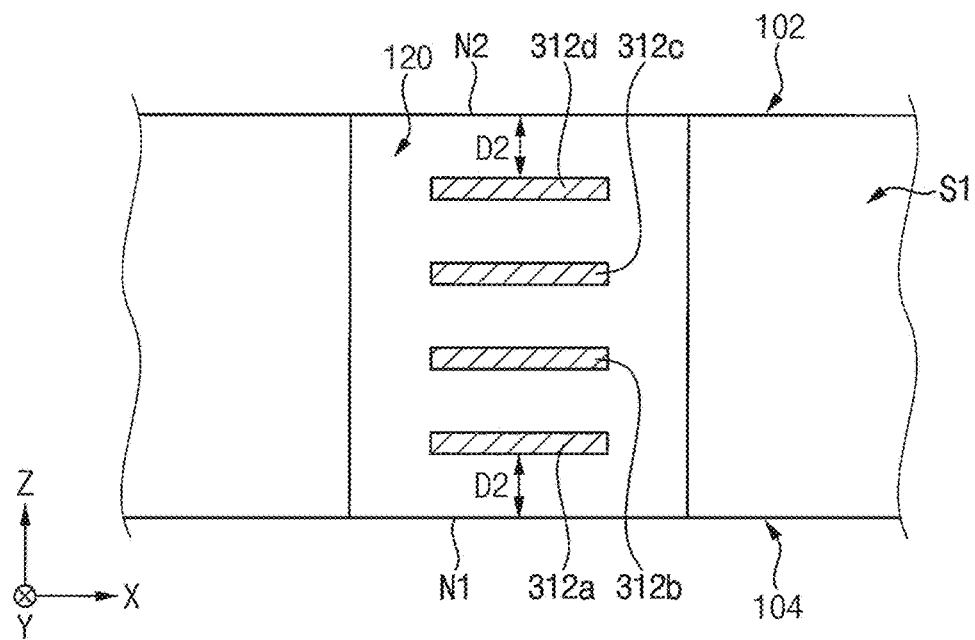

FIG. 3 is a plan view illustrating a portion of an inspection pad portion of a memory module in accordance with some example embodiments. FIG. 4 is a cross-sectional view taken along the line A-A' in FIG. 3. FIG. 5 is a perspective view illustrating a through-groove test terminal of the inspection pad portion in FIG. 3. FIG. 6 is a plan view illustrating a fourth contact pad of the through-groove test terminal in FIG. 5. FIG. 7 is a front view illustrating the through-groove test terminal in FIG. 5.

Referring to FIGS. 3 to 7, a module substrate 100 may include a wiring substrate and a through-groove test terminal 312 provided in an inner wall of a through groove 120 of the wiring substrate. The through-groove test terminal 312 may include at least one contact pad provided in the inner wall of the through groove 120. Throughout this disclosure, the module substrate 100 may be interchangeably referred to as the wiring substrate.

In some example embodiments, the wiring substrate may include a plurality of stacked insulation layers and conductive patterns provided in the insulation layers, respectively.

For example, first to fifth insulation layers 110a, 110b, 110c, 110d, 110e may be sequentially stacked on one another. The first insulation layer 110a may be a lower cover insulation layer, the second insulation layer 110b may be a lower insulation layer, the third insulation layer 110c may be a core layer, the fourth insulation layer 110d may be an upper insulation layer, and the fifth insulation layer 110e may be an upper cover insulation layer.

For example, the insulation layer may include an insulating material having a thermosetting resin such as epoxy resin or a thermoplastic resin such as polyimide. The insulation layer may include a resin impregnated in a core material such as organic fiber (glass fiber), for example, a prepreg, FR-4, or BT (Bismaleimide Triazine).

A first conductive pattern 310a may be formed on a lower surface of the second insulation layer 110b, and a second conductive pattern 310b may be formed on an upper surface of the second insulation layer 110b. A third conductive pattern 310c may be formed on a lower surface of the fourth insulation layer 110d, and a fourth conductive pattern 310d may be formed on an upper surface of the fourth insulation layer 110d. For example, the conductive pattern may include a metal material such as copper or aluminum.

It will be understood that arrangements and numbers of the insulation layers and the conductive patterns are exemplary, and are not limited thereto.

At least one through groove 120 may be provided in a first sidewall S1 of the module substrate 100. The through groove 120 may extend in a thickness direction of the module substrate 100, that is, in the stacking direction of the insulation layers (Z direction). When viewed in plan view, the through groove 120 may have a shape recessed from the first sidewall S1 to the inside. For example, the through groove 120 may have a semi-circle or semi-elliptical shape or a trapezoidal shape when viewed in plan view.

As illustrated in FIGS. 4 and 5, the first to fifth insulation layers 110a, 110b, 110c, 110d, 110e may have first to fifth semicircular holes 120a, 120b, 120c, 120d, 120e provided in sidewalls thereof, respectively. The through groove 120 may include the first to fifth semicircular holes 120a, 120b, 120c, 120d, 120e.

The first conductive pattern 310a may be provided on the lower surface of the second insulation layer 110b to extend toward the inner wall of the through groove 120 in the second direction, and an end portion of the first conductive pattern 310a may be exposed from the inner wall of the through groove 120. The end portion of the first conductive pattern 310a exposed from the inner wall of the through groove 120 may be referred to as a first contact pad 312a. The first contact pad 312a may be formed integrally with the first conductive pattern 310a. A width of the first contact pad 312a may be greater than a width of the first conductive pattern 310a (e.g., a width of a portion other than the end portion of the first conductive pattern 310a). In this case, the first contact pad 312a may extend by a desired (or alternatively, predetermined) length along the inner wall of the second semicircular hole 120b.

The second conductive pattern 310b may be provided on the upper surface of the second insulation layer 110b to extend toward the inner wall of the through groove 120 in the second direction, and an end portion of the second conductive pattern 310b may be exposed from the inner wall of the through groove 120. The end portion of the second conductive pattern 310b exposed from the inner wall of the through groove 120 may be referred to as a second contact pad 312b. The second contact pad 312b may be formed integrally with the second conductive pattern 310b. A width of the second contact pad 312b may be greater than a width of the second conductive pattern 310b (e.g., a width of a portion other than the end portion of the second conductive pattern 310b). In this case, the second contact pad 312b may extend by a desired (or alternatively, predetermined) length along the inner wall of the second semicircular hole 120b.

The third conductive pattern 310c may be provided on the lower surface of the fourth insulation layer 110d to extend toward the inner wall of the through groove 120 in the second direction, and an end portion of the third conductive pattern 310c may be exposed from the inner wall of the through groove 120. The end portion of the third conductive pattern 310c exposed from the inner wall of the through groove 120 may be referred to as a third contact pad 312c. The third contact pad 312c may be formed integrally with the third conductive pattern 310c. A width of the third contact pad 312c may be greater than a width of the third conductive pattern 310c (e.g., a width of a portion other than the end portion of the third conductive pattern 310c). In this case, the third contact pad 312c may extend by a desired (or alternatively, predetermined) length along the inner wall of the fourth semicircular hole 120d.

The fourth conductive pattern 310d may be provided on the upper surface of the fourth insulation layer 110d to extend toward the inner wall of the through groove 120 in the second direction, and an end portion of the fourth conductive pattern 310d may be exposed from the inner wall of the through groove 120. The end portion of the fourth conductive pattern 310d exposed from the inner wall of the through groove 120 may be referred to as a fourth contact pad 312d. The fourth contact pad 312d may be formed integrally with the fourth conductive pattern 310d. A width V of the fourth contact pad 312d may be greater than a width W of the fourth conductive pattern 310d (e.g., a width of a portion other than the end portion of the fourth conductive pattern 310d). In this case, the fourth contact pad 312d may extend by a desired (or alternatively, predetermined) length V along the inner wall of the fourth semicircular hole 120d.

Accordingly, the through-groove test terminal 312 may include the first to fourth contact pads 312a, 312b, 312c, 312d, a surface of each of which is exposed from the inner wall of the through groove 120. The first to fourth contact pads 312a, 312b, 312c, 312d may be spaced apart from each other in the stacking direction. A pogo pin of a tester may be inserted into the through groove 120 to simultaneously contact the first to fourth contact pads 312a, 312b, 312c, 312d.

The first to fourth conductive patterns 310a, 310b, 310c, 310d may be connected to one via 324. The via 324 may be electrically connected to a semiconductor device 200 through a signal line 311. Accordingly, the through-groove test terminal 312 may be electrically connected to the semiconductor device 200 by the via 324 and the signal line 311.

As illustrated in FIGS. 6 and 7, the through-groove test terminal 312 may be spaced apart by a desired (or alternatively, predetermined) distance D1 from a vertical plane M extending from the first sidewall S1. The exposed surfaces of the first to fourth contact pads 312a, 312b, 312c, 312d may be spaced apart from the vertical plane M by the desired (or alternatively, predetermined) distance D1.

For example, a distance between both end portions of the inner wall of the through groove 120 in contact with the first sidewall S1, that is, a diameter D of the through groove 120 may be within a range of 200 µm to 800 µm. The spacing distance between the contact pads and the vertical plane M may be within a range of 80 µm to 320 µm.

Further, the through-groove test terminal 312 may be spaced apart by a desired (or alternatively, predetermined) distance D2 from each or either one of first and second horizontal planes N1, N2, the first horizontal plane N1 being a plane extending from the upper surface 102 of the wiring substrate and the second horizontal plane N2 being a plane extending from the lower surface 104 of the wiring substrate. The exposed surface of the first contact pad 312a may be spaced apart from the first horizontal plane N1 by the desired (or alternatively, predetermined) distance D2. The exposed surface of the fourth contact pad 312d may be spaced apart from the second horizontal plane N2 by the desired (or alternatively, predetermined) distance D2.

For example, a thickness of the wiring substrate may be within a range of 400 µm to 1,600 µm, and the distance between the first contact pad 312a and the first horizontal plane N1 and the distance between the fourth contact pad 312d and the second horizontal plane N2 may be within a range of 50 µm to 200 µm.

The through-groove test terminal 312 may occupy a portion of the inner wall area of the through groove 120. For example, the exposed surfaces of the first to fourth contact pads 312a, 312b, 312c, 312d may occupy at least 20% of the inner wall area of the through groove 120.

As described above, the semiconductor module 10 may include a module substrate 100 and a semiconductor device 200 mounted on the module substrate 100. The module substrate 100 may include the wiring substrate having the at least one through groove 120 in the sidewall thereof and extending in the thickness direction thereof and the through-groove test terminal 312 having the at least one contact pad exposed from the inner wall of the through groove 120.

The through-groove test terminal 312 may include the first to fourth contact pads 312a, 312b, 312c, 312d which are provided on the inner wall of the through groove 120 to be spaced apart from each other in the thickness direction of the wiring substrate. The through-groove test terminal 312 may be spaced apart by the desired (or alternatively, predetermined) distance D1 from the vertical plane M extending from the first sidewall S1. The through-groove test terminal 312 may be spaced apart by the desired (or alternatively, predetermined) distance D2 from the first and second horizontal planes N1 and N2 extending from the upper surface 102 and the lower surface 104 of the wiring substrate.

Accordingly, interface signal connection terminals for inspection of a semiconductor device may be arranged in the sidewall of the wiring substrate having a small or micro form factor, thereby securing a design space for debug pads. Additionally, because copper contact pads are not exposed from the sidewalls of the wiring substrate, it may be possible to improve contact reliability with the inspection pogo pin while satisfying PCB design regulations.

Figure 8:
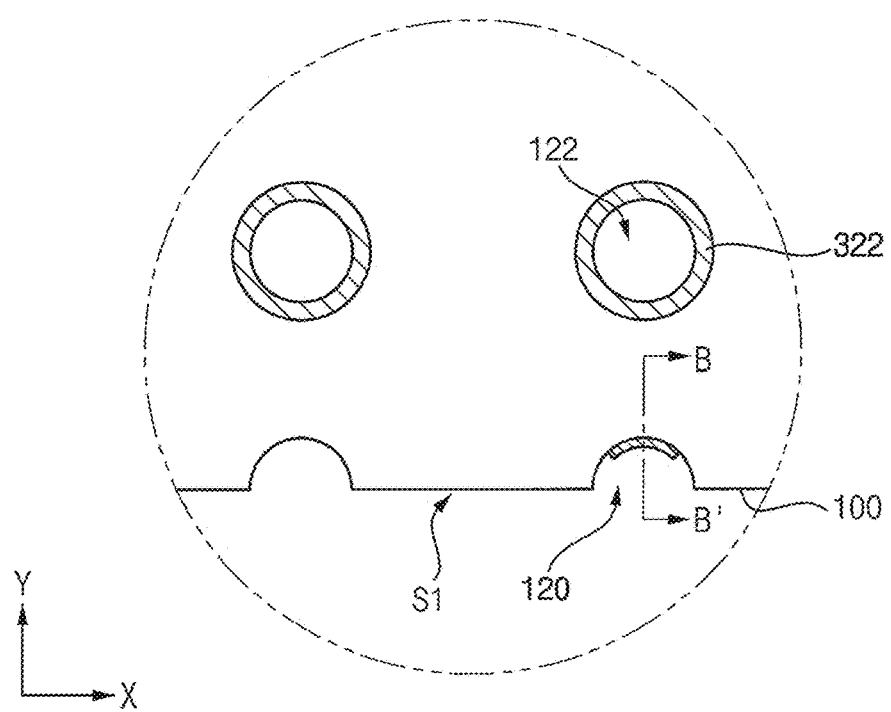
Figure 9:
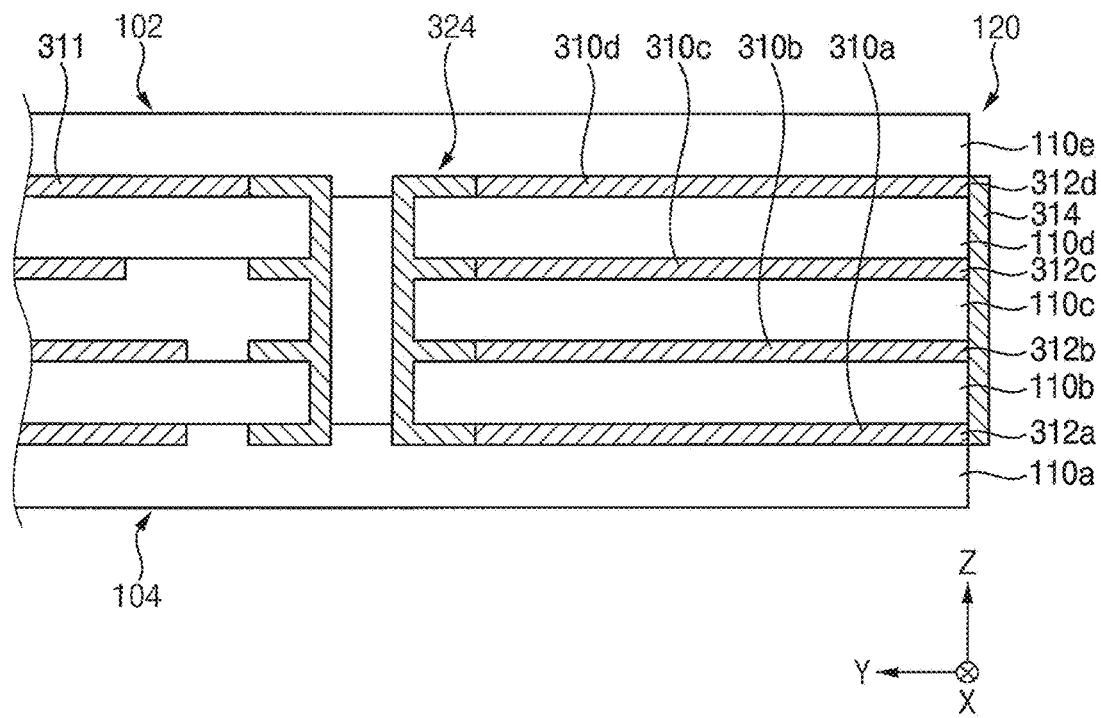
Figure 10:
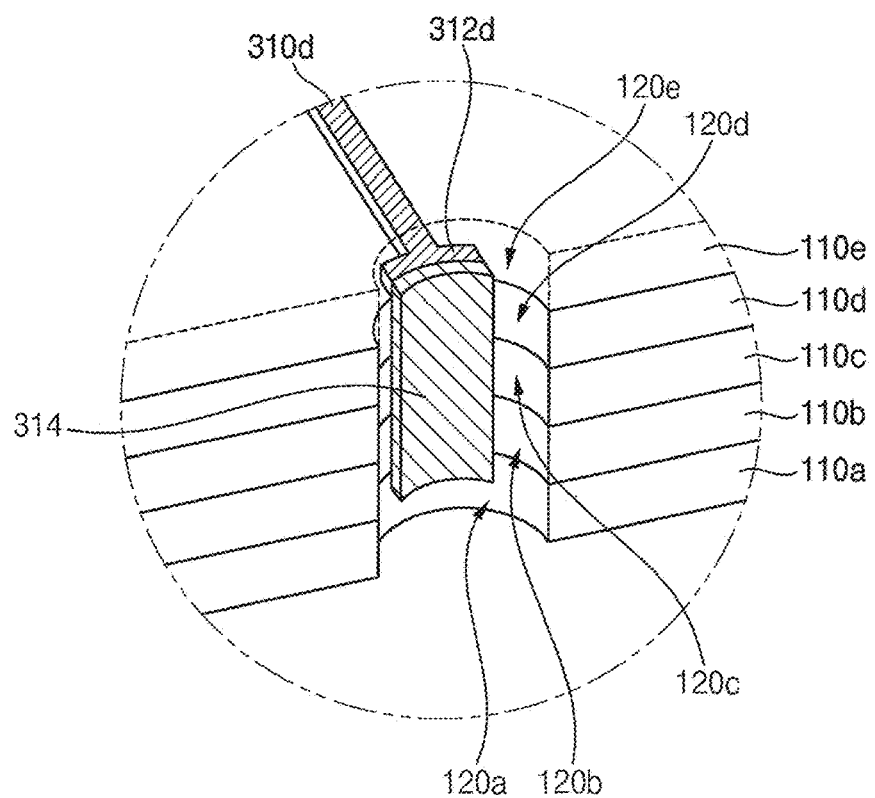
Figure 11:
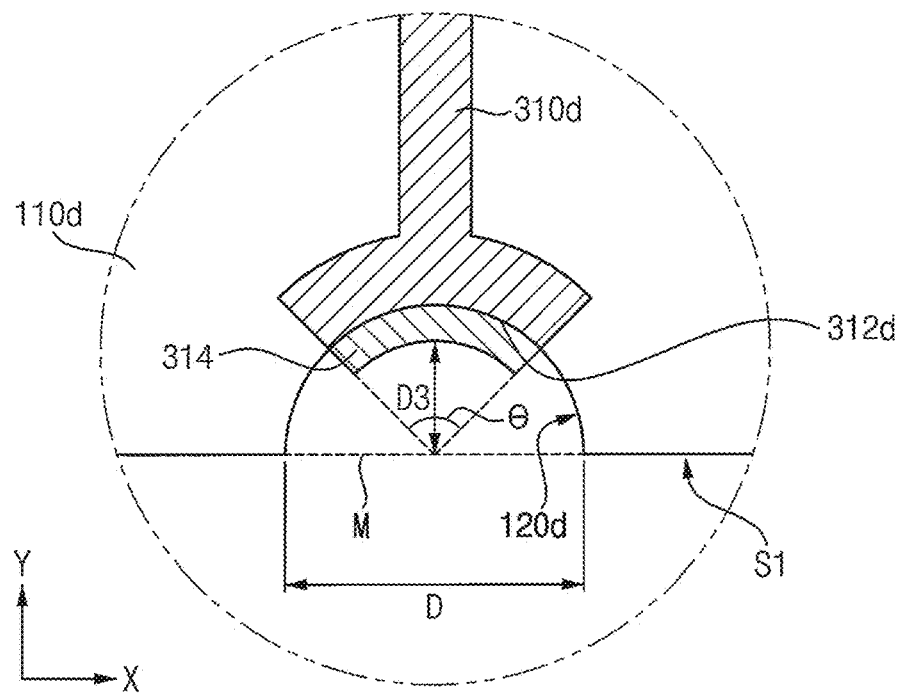
Figure 12:
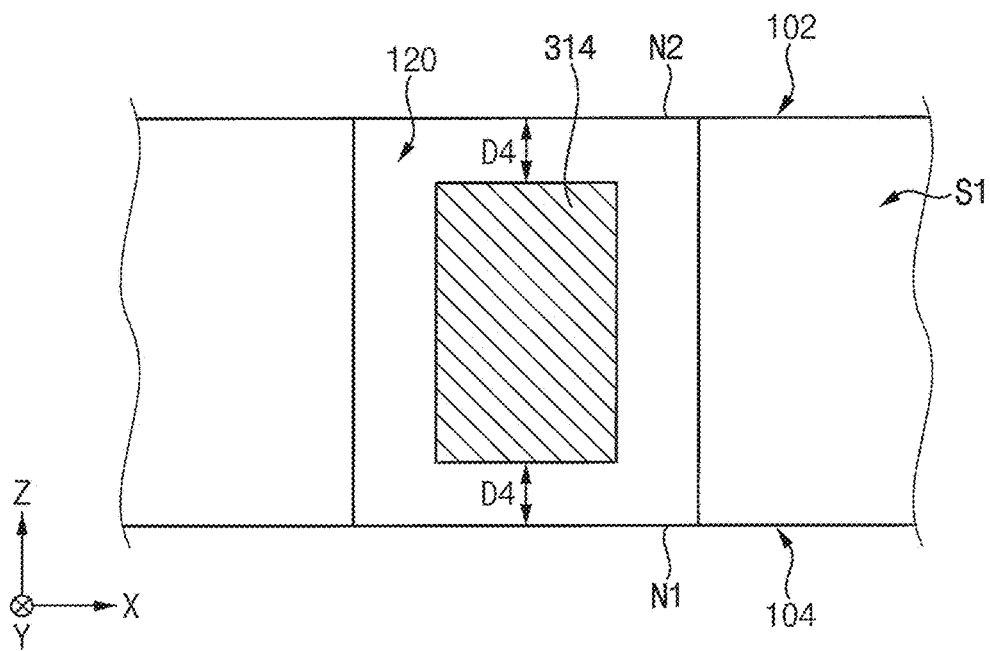

FIG. 8 is a plan view illustrating a portion of an inspection pad portion of a memory module in accordance with some example embodiments. FIG. 9 is a cross-sectional view taken along the line B-B' in FIG. 8. FIG. 10 is a perspective view illustrating a through-groove test terminal of the inspection pad portion in FIG. 8. FIG. 11 is a plan view illustrating a fourth contact pad and a plating pattern of the through-groove test terminal in FIG. 10. FIG. 12 is a front view illustrating the through-groove test terminal in FIG. 10. The through-groove test terminal may be the same as or substantially similar to the through-groove test terminal described with reference to FIGS. 3 to 7 except for a configuration of an additional plating pattern. Thus, same reference numerals will be used to refer to the same or like elements and any further repetitive explanation concerning the above elements will be omitted.

Referring to FIGS. 8 to 12, a through-groove test terminal may include at least one contact pad provided in an inner wall of a through groove 120 and a plating pattern 314 on the inner wall of the through groove 120 to cover the contact pad.

In some example embodiments, the plating pattern 314 may be provided on the inner wall of the through groove 120 and extends by a desired (or alternatively, predetermined) length in a thickness direction (Z direction) of a wiring substrate.

As illustrated in FIGS. 9 and 10, the plating pattern 314 may make contact with exposed surfaces of first to fourth contact pads 312a, 312b, 312c, 312d. The plating pattern 314 may cover the exposed surfaces of the first to fourth contact pads 312a, 312b, 312c, 312d and portions of surfaces of second to fourth insulation layers 110b, 110c, 110d therebetween.

The plating pattern 314 may be electrically connected to first to fourth conductive patterns 310a, 310b, 310c, 310d by the first to fourth contact pads 312a, 312b, 312c, 312d. The first to fourth conductive patterns 310a, 310b, 310c, 310d may be connected to one via 324. Accordingly, the through-groove test terminal may be electrically connected to a semiconductor device 200 by the via 324 and a signal line 311.

A plating layer may be formed on the inner wall of the through groove 120 by an electroplating process, and then the plating layer may be patterned by an etching process or a drilling process to form the plating pattern 314. For example, the plating pattern may include a metal material such as copper or nickel.

As illustrated in FIGS. 11 and 12, the plating pattern 314 may be spaced apart by a desired (or alternatively, predetermined) distance D3 from a vertical plane M extending from a first sidewall S1. The plating pattern 314 may have a central angle θ with respect to the center of the through groove 120. The central angle θ may have an angular range of 30 degrees to 70 degrees.

For example, a distance between both end portions of the inner wall of the through groove 120 in contact with the first sidewall S1, that is, a diameter D of the through groove 120 may be within a range of 200 µm to 800 µm. The spacing distance between the plating pattern and the vertical plane M may be within a range of 60 μm to 300 μm.

Further, the plating pattern 314 may be spaced apart by a desired (or alternatively, predetermined) distance D4 from each or either one of first and second horizontal planes N1, N2, the first horizontal plane N1 being a plane extending from an upper surface 102 of the wiring substrate and the second horizontal plane N2 being a plane extending from a lower surface 104 of the wiring substrate. A lower surface of the plating pattern 314 may be spaced apart from the first horizontal plane N1 by the distance D4. An upper surface of the plating pattern 314 may be spaced apart from the second horizontal plane N2 by the desired (or alternatively, predetermined) distance D4.

For example, a thickness of the wiring substrate may be within a range of 400 μm to 1,600 μm, and the distance between the lower surface of the plating pattern 314 and the first horizontal plane N1 and the distance between the upper surface of the plating pattern 314 and the second horizontal plane N2 may be within a range of 50 μm to 200 μm.

The plating pattern 314 may occupy a portion of the inner wall area of the through groove 120. For example, the plating pattern 314 may occupy at least 40% of the inner wall area of the through groove 120.

Figure 13:
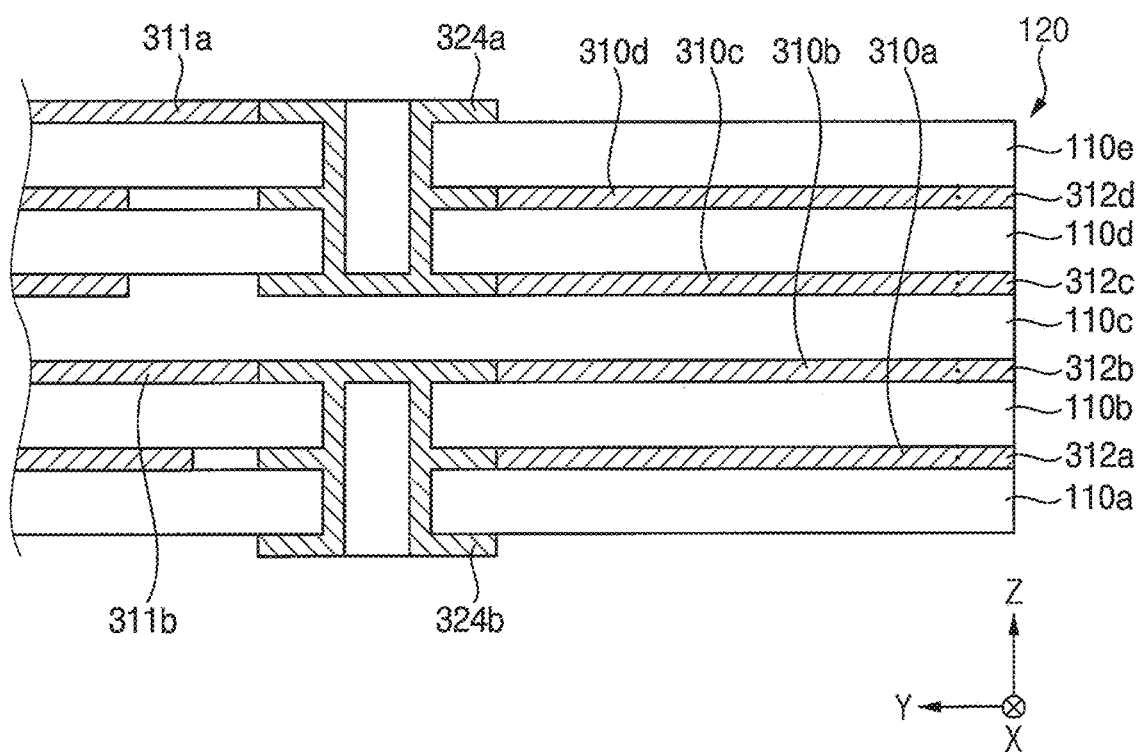

FIG. 13 is a cross-sectional view illustrating a through groove test terminal formed in a wiring substrate in accordance with some example embodiments.

Referring to FIG. 13, a through-groove test terminal may include first to fourth contact pads 312a, 312b, 312c, 312d exposed from an inner wall of a through groove 120, and the first to fourth contact pads 312a, 312b, 312c, 312d may be connected to first to fourth conductive patterns 310a, 310b, 310c, 310d, respectively.

In some example embodiments, the first and second conductive patterns 310a, 310b may be connected to a first via 324a, and the first via 324a may be electrically connected to a semiconductor device 200 through a first signal line 311a. The third and fourth conducive patterns 310c, 310d may be connected to a second via 324b, and the second via 324b may be electrically connected to the semiconductor device 200 through a second signal line 311b.

For example, the first and second vias 324a, 324b may include a blind via or a buried via.

Accordingly, when a pogo pin of a tester is inserted into the through groove 120 to contact the first to fourth contact pads 312a, 312b, 312c, 312d at the same time, an inspection mode or operation mode (debug mode or operation mode) may be controlled according to an internal signal connection state of the first to fourth contact pads.

Figure 14:
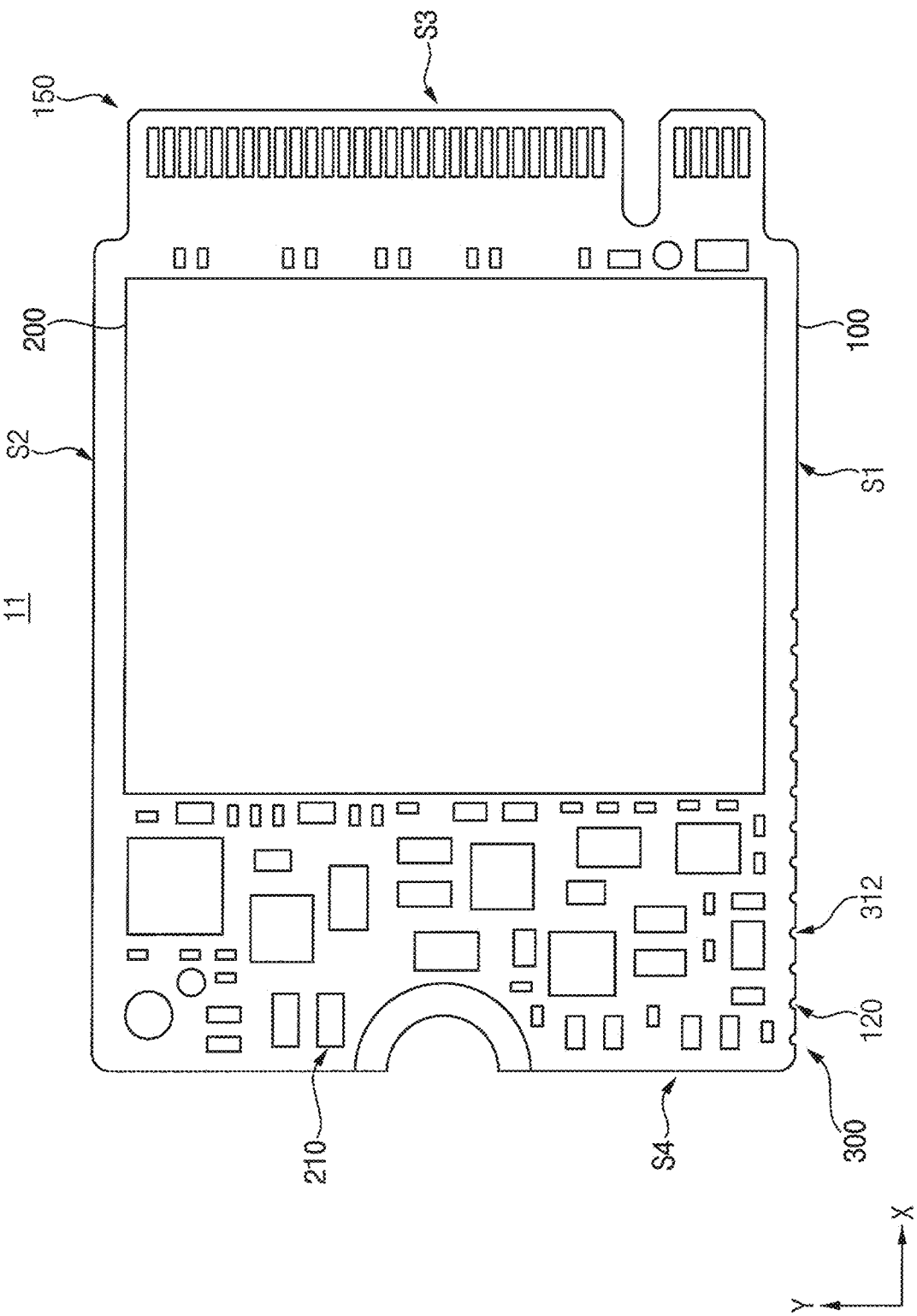

FIG. 14 is a plan view illustrating a memory module in accordance with some example embodiments. The memory module may be the same as or substantially similar to the memory module described with reference to FIG. 1 except for a configuration of an inspection pad portion. Thus, same reference numerals will be used to refer to the same or like elements and any further repetitive explanation concerning the above elements will be omitted.

Referring to FIG. 14, an inspection pad portion 300 of a memory module 11 may be provided in a through groove 120 formed in at least one inner wall of a module substrate 100. The inspection pad portion 300 may include through-groove test terminals 312 provided in the through grooves 120, respectively. The through-groove test terminal may be the same as or substantially similar to the through-groove test terminal described with reference to FIGS. 3 to 7.

In some example embodiments, the test terminals of the inspection pad portion 300 may be provided only in the through grooves 120 formed in the inner wall of a wiring substrate.

For example, the through grooves 120 may be formed in a first sidewall S1 to be spaced apart from each other along a first direction (X direction). The through-groove test terminals may be provided on inner walls of the through grooves 120, respectively. For example, the inspection pad portion may include 10 through-groove test terminals. However, arrangements and the number of the through-groove test terminals may not be limited thereto.

Thus, because the test pads are provided only on the sidewalls of the wiring substrate, a design space for electronic components and interface signal connection pads may be secured sufficiently.

Memory modules according to some example embodiments have been described as being applied to an SSD, but it may not be limited thereto, and the memory module may be implemented as a semiconductor module including a plurality of memory devices.

The host (or the host system) and the memory module disclosed in the present disclosure may be implemented as processing circuitry such as hardware including logic circuits or a combination of hardware and software such as a processor executing software. For example, the processing circuitry may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of some example embodiments and is not to be construed as limiting thereof. Although a few example embodiments have been described, those skilled in the art will readily appreciate that many modifications are possible in the disclosed example embodiments without materially departing from the novel teachings and advantages of the present inventive concepts. Accordingly, all such modifications to the disclosed example embodiments are intended to be included within the scope of the appended claims.

What is claimed is:

1. A module substrate for a semiconductor module, comprising:
    a wiring substrate having an upper surface and a lower surface opposite to each other and including a wiring formed therein, the wiring substrate having at least one through groove in at least one sidewall and extending in a thickness direction; and
    a through-groove test terminal including at least one contact pad, a surface of the contact pad being exposed from an inner wall of the through groove,
    wherein the contact pad is spaced apart from a vertical plane extending from the sidewall of the wiring substrate.

2. The module substrate for the semiconductor module of claim 1, wherein the wiring substrate includes a plurality of stacked insulation layers, a plurality of conductive patterns provided on the insulation layers, respectively, and a plurality of contact pads electrically connected to the conductive patterns, respectively.

3. The module substrate for the semiconductor module of claim 2, wherein the contact pads are spaced apart from each other along a stacking direction of the insulation layers.

4. The module substrate for the semiconductor module of claim 2, wherein a plurality of the contact pads occupies at least 20% of an area of the inner wall of the through groove.

5. The module substrate for the semiconductor module of claim 1, wherein the through-groove test terminal further includes a plating pattern on the inner wall of the through groove, the plating pattern configured to cover the exposed surface of the contact pad and being spaced apart from the vertical plane by a distance.

6. The module substrate for the semiconductor module of claim 5, wherein the contact pad includes a plurality of contact pads, the contact pads electrically connected to a plurality of conductive patterns, respectively, and the plating pattern cover surfaces of the contact pads.

7. The module substrate for the semiconductor module of claim 5, wherein the plating pattern occupies at least 40% of an area of the inner wall of the through groove.

8. The module substrate for the semiconductor module of claim 1, wherein a first distance between both end portions of the inner wall of the through groove in contact with the sidewall is within a range of 200 μm to 800 μm, and a second distance between the contact pad and the vertical plane is within a range of 80 μm to 320 μm.

9. The module substrate for the semiconductor module of claim 1, wherein the contact pad is spaced apart from a horizontal plane, which extends from the upper surface or the lower surface of the wiring substrate, by a distance.

10. The module substrate for the semiconductor module of claim 9, wherein a thickness of the wiring substrate is within a range of 400 μm to 1,600 μm, and the distance between the contact pad and the horizontal plane is within a range of 50 μm to 200 μm.

11. A module substrate for a semiconductor module, comprising:
a wiring substrate including first to fifth insulation layers and first to fourth conductive patterns between the first to fifth insulation layers, the wiring substrate having at least one through groove, the through groove in at least one sidewall of the wiring substrate and extending in a stacking direction of the first to fifth insulation layers; and
a through-groove test terminal including first to fourth contact pads, the first to fourth contact pads electrically connected to the first to fourth conductive patterns, respectively, surfaces of the first to fourth contact pads being exposed from an inner wall of the through groove,
wherein the first to fourth contact pads are spaced apart from a vertical plane extending from the sidewall of the wiring substrate, and
wherein a first distance between both end portions of the inner wall of the through groove that are in contact with the sidewall of the wiring substrate is within a range of 200 μm to 800 μm, and a second distance between each of the first to fourth contact pads and the vertical plane is within a range of 80 μm to 320 μm.

12. The module substrate for the semiconductor module of claim 11, wherein the through-groove test terminal occupies at least 20% of an area of the inner wall of the through groove.

13. The module substrate for the semiconductor module of claim 11, wherein the through-groove test terminal further includes a plating pattern on the inner wall of the through groove, the plating pattern configured to cover the exposed surfaces of the first to fourth contact pads and being spaced apart from the vertical plane by a third distance.

14. The module substrate for the semiconductor module of claim 11, wherein the first to fourth conductive patterns are connected to a via that penetrates at least a portion of the wiring substrate.

15. The module substrate for the semiconductor module of claim 11, wherein
some of the first to fourth conductive patterns are connected to a first via that penetrates at least a portion of the wiring substrate and others of the first to fourth conductive patterns are connected to a second via that penetrates another portion of the wiring substrate.

16. A semiconductor module, comprising:
a wiring substrate including a plurality of insulation layers and conductive patterns on the insulation layers, respectively, the wiring substrate having at least one through groove in at least one sidewall and extending in a stacking direction of the insulation layers;
a semiconductor device on an upper surface or a lower surface of the wiring substrate; and
a through-groove test terminal electrically connected to the conducive patterns for electrically inspecting the semiconductor device, the through-groove test terminal including a plurality of contact pads, surfaces of the contact pads being exposed from an inner wall of the through groove,
wherein the exposed surfaces of the contact pads are arranged along the inner wall of the through groove and are spaced apart from a vertical plane extending from the sidewall of the wiring substrate.

17. The semiconductor module of claim 16, wherein the semiconductor device includes a nonvolatile memory device and a controller connected to the nonvolatile memory device.

18. The semiconductor module of claim 16, wherein a plurality of the contact pads occupies at least 20% of an area of the inner wall of the through groove.

19. The semiconductor module of claim 16, wherein the through-groove test terminal further includes a plating pattern on the inner wall of the through groove and configured to cover the exposed surfaces of the contact pads.

20. The semiconductor module of claim 19, wherein the plating pattern occupies at least 40% of an area of the inner wall of the through groove.

* * * * *